US008732539B2

(12) United States Patent
Lutz et al.

(10) Patent No.: US 8,732,539 B2
(45) Date of Patent: *May 20, 2014

(54) TEST SYSTEM HAVING A SUB-SYSTEM TO SUB-SYSTEM BRIDGE

(71) Applicant: AT&T Intellectual Property I, L.P., Atlanta, GA (US)

(72) Inventors: Charles Lutz, Flowery Branch, GA (US); Jason Speilvogel, Wheeling, WV (US); Nicole Nall, Lithonia, GA (US); Barron Cain, Roswell, GA (US); William Keyes, Dacula, GA (US); Gregory Irwin, Duluth, GA (US)

(73) Assignee: AT&T Intellectual Property I, L.P., Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/874,690

(22) Filed: May 1, 2013

(65) Prior Publication Data

US 2013/0318415 A1 Nov. 28, 2013

Related U.S. Application Data (63) Continuation of application No. 13/533,308, filed on Jun. 26, 2012, now Pat. No. 8,443,245, which is a continuation of application No. 11/944,855, filed on Nov. 26, 2007, now Pat. No. 8,230,278.

(51) Int. Cl.
*G01R 31/28* (2006.01)

(52) U.S. Cl.
USPC .......................................... 714/724; 370/242

(58) Field of Classification Search
USPC ....................................................... 714/1–50
See application file for complete search history.

(56) References Cited

U.S. PATENT DOCUMENTS

| | | | |
|---|---|---|---|
| 5,398,252 A * | 3/1995 | Ohashi .......................... 714/736 |
| 6,016,525 A * | 1/2000 | Corrigan et al. .............. 710/100 |
| 6,268,738 B1 * | 7/2001 | Gunthorpe et al. ...... 324/750.02 |
| 6,865,503 B2 | 3/2005 | Harper et al. |
| 7,020,802 B2 | 3/2006 | Gross et al. |
| 7,100,092 B2 * | 8/2006 | Allred et al. ..................... 714/43 |
| 7,496,820 B1 * | 2/2009 | Theron et al. ................. 714/738 |
| 7,502,965 B2 | 3/2009 | Bennett et al. |
| 7,571,347 B2 * | 8/2009 | Gross et al. ..................... 714/15 |
| 7,613,576 B2 * | 11/2009 | Gross et al. ..................... 702/57 |

OTHER PUBLICATIONS

Dempsey, R. "Remote Telemetry Testing Module (RTTM)", Oceans '87, pp. 322-324 (Sep. 28, 1987-Oct. 1, 1987).

* cited by examiner

*Primary Examiner* — Steve Nguyen
(74) *Attorney, Agent, or Firm* — Parks IP Law LLC; Jennifer P. Medlin, Esq.

(57) ABSTRACT

A test system having a sub-system to sub-system bridge may be provided that utilizes the useful attributes of a plurality of circuit testing techniques, while reducing deficiencies associated with certain types of circuit testing. A bridged test system structure is utilized to facilitate circuit testing that is more effective and time efficient. The method analyzes performance data acquired by a first component for one or more circuits, and sends that performance data to a second test component. The second test component provides test signals to the circuits, using the performance date to enhance the use of the test signals, and also provides test response data for the circuits in response to the provided test signals.

20 Claims, 6 Drawing Sheets

TEST SYSTEM HAVING A SUB-SYSTEM TO SUB-SYSTEM BRIDGE

BACKGROUND

A test system having a sub-system to sub-system bridge is a system for troubleshooting circuits. When troubleshooting circuits in a telecommunications network, for example, testing circuit functionality may occur using a passive circuit test, or by injecting a test signal into the circuit (active testing), or any other form of circuit testing. However, these forms of circuit testing each have deficiencies in troubleshooting and diagnosing circuits in a network. For example, when passively testing a circuit, circuit telemetry, e.g. circuit fault and alarm data sent by the circuit, test signals are input into the circuit to determine circuit responsiveness. Also, a passive circuit test fails to sectionalize a circuit under test causing difficulty in pinpointing circuit problems. Actively testing a circuit may fail to touch a designated element with the circuit because such testing cannot loop all requested test points within the circuit. Also, active testing cannot be used on all circuit elements and may not have a point of reference for testing a circuit, because a technician may not have an indication of where the circuit is operating incorrectly.

SUMMARY

A test system having a sub-system to sub-system bridge is provided, and embodiments of the present invention include a method for circuit testing. The method analyzes performance data for one or more predetermined circuits acquired by a first test component. The method sends the performance data for the one or more predetermined circuits to a second test component. The method provides test signals to the one or more predetermined circuits, using the performance data to enhance the use of the test signals. The method also obtains test response data for the one or more predetermined circuits in response to the provided test signals. The method determines if the one or more predetermined circuits are operating correctly.

Embodiments of the present invention include a computer-readable medium storing a set of instructions that, when executed, performs a method for circuit testing. The computer-readable medium obtains performance data for one or more predetermined circuits acquired by a first test component. The computer-readable medium sends the performance data for the one or more predetermined circuits to a second test component. The computer-readable medium maps a circuit layout for the one or more predetermined circuit using the second test component. The computer-readable medium provides test signals to the one or more predetermined circuits using the performance data to enhance the use of the test signals. The computer-readable medium obtains test response data for the one or more predetermined circuits in response to the provided test signals. The computer-readable medium also determines if the one or more predetermined circuits is operating correctly.

Embodiments of the present invention include a system for circuit testing. The system may include a passive circuit test sub-system to passively test one or more predetermined circuits, and may include an active circuit test sub-system for actively testing the one or more predetermined circuits. The system may include a test system bridge for transmitting data from the passive circuit test sub-system to the active circuit test sub-system. The system may include a circuit troubleshooting application to perform circuit testing on the one or more predetermined circuits using the passive circuit test sub-system and active circuit test sub-system.

Other systems, methods, and/or computer program products according to embodiments will be or become apparent to one with skill in the art upon review of the following drawings and detailed description. It is intended that all such additional systems, methods, and/or computer program products be included within this description, be within the scope of the present invention, and be protected by the accompanying claims.

BRIEF DESCRIPTION OF THE DRAWINGS

The accompanying drawings, which are incorporated in and constitute a part of this disclosure, illustrate various embodiments of the present invention. In the drawings.

DETAILED DESCRIPTION

The following detailed description refers to the accompanying drawings. Wherever possible, the same reference numbers are used in the drawings and the following description to refer to the same or similar elements. While embodiments of the invention may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the invention. Instead, the proper scope of the invention is defined by the appended claims.

A test system having a sub-system to sub-system bridge may be provided. Consistent with embodiments of the present invention, a method, system, and computer readable medium for circuit testing is disclosed. Often, when attempting to troubleshoot a circuit, many different methods may be employed. However, each troubleshooting technique includes certain testing deficiencies, thereby providing an incomplete assessment of circuit functionality or lack thereof. Accordingly, a system that utilizes the useful attributes of a plurality of circuit testing techniques, while reducing deficiencies associated with certain types of circuit testing, is desired. Therefore, a bridged test system structure as embodied herein may be utilized to facilitate circuit testing that is more effective and time efficient.

An embodiment consistent with the invention includes a system for circuit testing. The system obtains performance data for one or more predetermined circuits acquired by a first test component, and sends the performance data for the one or more predetermined circuits to a second test component. The system maps a circuit layout for the one or more predetermined circuits using the second test component, and provides test signals to the one or more predetermined circuits using the performance data to enhance the use of the test signals.

The system obtains test response data for the one or more predetermined circuits in response to the provided test signals. The system also determines if the one or more predetermined circuits are operating correctly. By utilizing performance data acquiring through passive testing of a circuit being tested prior to actively testing the circuit, additional circuit history information, performance data, and additional circuit test points may be utilized to create a more complete assessment of circuit functionality.

Figure 1:
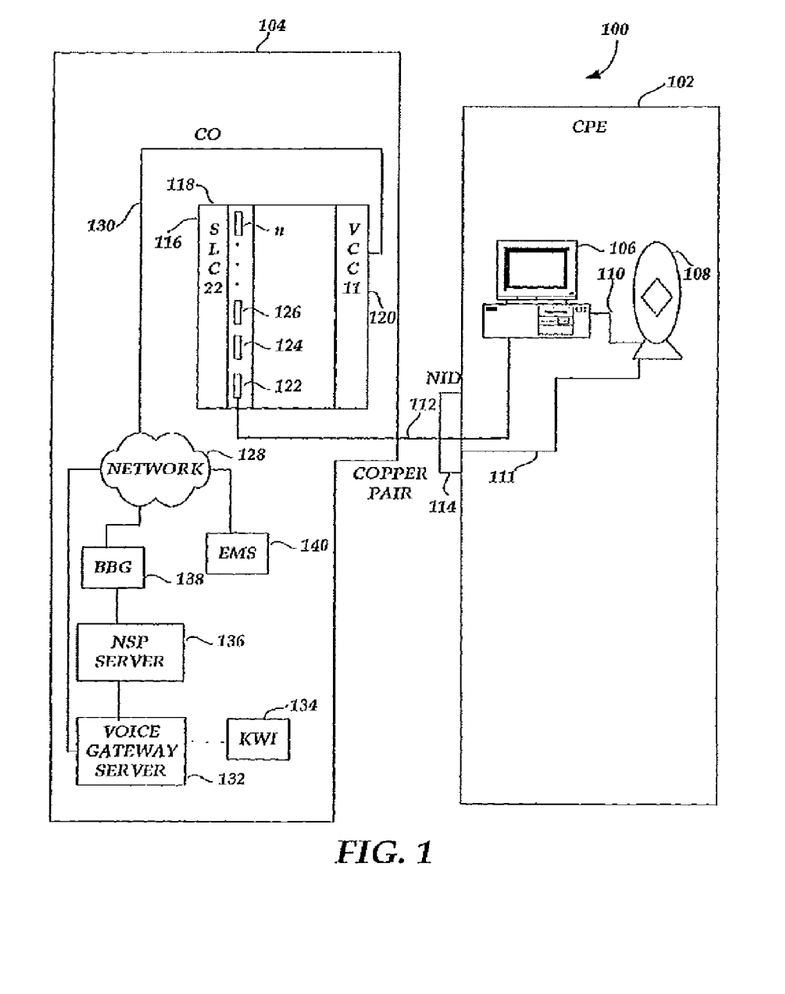
FIG. 1 illustrates a communications network consistent with an embodiment of the invention.

FIG. 1 illustrates a communications network 100 in which circuit testing may occur. The communications network 100 includes customer premises equipment (CPE) 102 having a computer 106 and a voice-enabled transceiver 108 in communication with the computer 106 via link 110. The link 110 may represent wireline or wireless communication between the computer 106 and the voice-enabled transceiver 108. The voice-enabled transceiver 108 is in communication with the link 110 via link 111, which may be, for example, an RJ-11 connection.

The communications network 100 includes a central office (CO) 104, which is in communication with the CPE 102 via a copper wire pair 112. The CO 104 may be connected to additional COs, or to an Inter-Exchange Carrier (IEC). The CPE 102 may provide dial-up access to network 128 or, more commonly, may provide a digital subscriber line (DSL) connection or any other communications medium. The copper wire pair 112 is connected to the internal wiring of the user's premises through a network interface device (NID) 114. As shown in FIG. 1, the CO 104 includes a subscriber line multiplexer 116 in communication with the copper wire pair 112. It will be appreciated that multiple copper wire pairs may be in communication with the subscriber line multiplexer 116. According to an embodiment of the invention, the subscriber line multiplexer 116 may include at least one subscriber line card (SLC) 118 for interfacing with a user's (subscriber) line. The subscriber line multiplexer 116 may also include a voice control card (VCC) 120 for aggregation package switching and a plurality of transceiving devices 122, 124, 126 . . . n.

The subscriber line multiplexer 116 may be in communication with the network 128, such as an asynchronous transfer mode (ATM) network, via link 130. Link 130 may be any link, such as an optical carrier link or T-3 (DS-3) line, operable to transport signals between the subscriber line multiplexer 116 and the network 128. A network service provider (NSP) server 136 may communicate with a broadband gateway (BBG) 138. The BBG 138 provides other services to users of the communications network 100, such as multiple sessions, more security, or enhanced aggregation. The NSP server 136 enables a user to connect to a network, such as the Internet.

A voice gateway server (VGS) 132 may also communicate with the network 128 and recognize protocols having a specific header attached by the voice-enabled transceiver 108. The VGS 132 may be described as a general purpose computing system having components including an operating system, a processor and memory space as described below for computing device 300 illustrated and described with reference to FIG. 3. The VGS 132 also includes a server key word identifier (KWI) application 134 operable to recognize the packetized instructions transmitted from the CPE 102 and retrieve information, such as a web link, web page, and/or IP addresses, from the network 128. The VGS 132 may attach a destination address, such as a uniform resource locator (URL) and/or Internet protocol (IP) address to a signal before transmitting the modified signal back to the CPE 102. The VGS 132 may also perform a similar function as if a user typed in a URL or IP address at the CPE 102.

However, the VGS 132, using the KWI application 134, may recognize commands input as voice commands at the voice-enabled transceiver 108 of the CPE 102 and convert those commands to protocol signals recognizable by the NSP server 136. The KWI application 134 of the VGS 132 may recognize key terms associated with user requested information, such as requested web links for example, and requests the information from the network 128 using known protocols, such as TCP/IP, UDP, etc. Information, such as a web page, link, or other information may be transmitted to the CPE 102, based upon the user's voice commands.

The communications network 100 also includes an element management system (EMS) 140 in communication with the network 128. The EMS 140 provides maintenance and provisioning capability. The EMS 140 may utilize a graphical user interface to allow an administrator to monitor an element by viewing traffic being passed on a given port of the element, and ensuring the traffic flow through the element.

Figure 2:
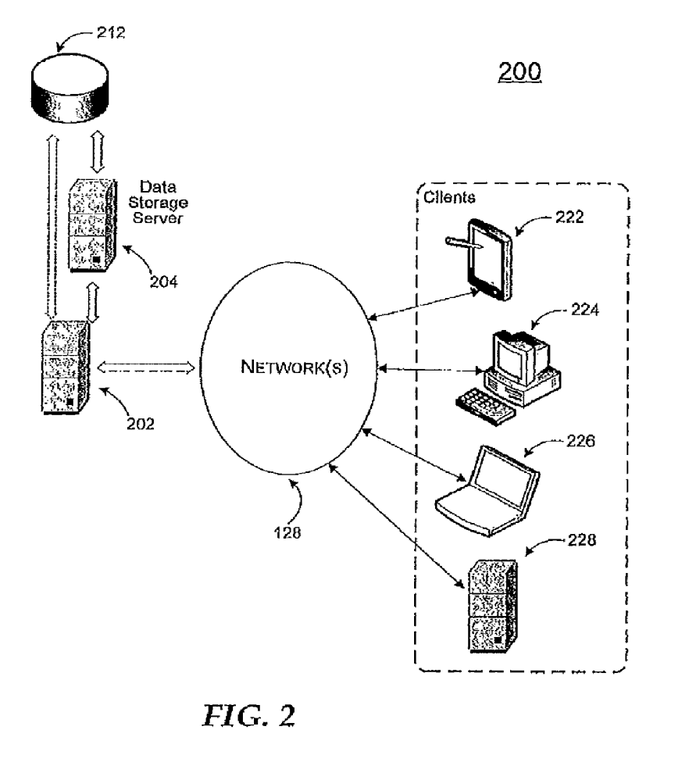
FIG. 2 illustrates a networked operating environment where embodiments of the invention may be practiced.

Referring to FIG. 2, a system 200 is illustrated where exemplary embodiments may be implemented. System 200 interacts with the communications network 100 shown in FIG. 1 using, for example, the network 128. System 200 may comprise any topology of servers, clients, Internet service providers, and communication media. Also, system 200 may have a static or dynamic topology. The term "client" may refer to a client application or a client device employed by a user to perform business logic operations. Computing devices within system 200 may use one or more programs or a server machine executing programs associated with managing one or more business controls. Both clients and application servers may be embodied as a single device (or program) or a number of devices (programs). Similarly, data sources may include one or more data stores, input devices, and the like.

A circuit troubleshooting application 320, described in more detail below with reference to FIG. 3, may be run centrally on a server 202 (FIG. 2) at for example CO 104, or in a distributed manner over several servers and/or client devices. For example, server 202 may be a web server which can utilize hypertext markup language (HTML), JAVA Script, and Microsoft® AST, and the like. A number of other applications may also be configured, deployed, and shared in system 100. In addition, the circuit troubleshooting application 320 may also be run in one or more client devices and information exchanged over network 128.

Data store 212 is an example of a number of data stores that may be utilized to store copies of the data acquired during circuit testing according to the disclosed embodiment. Data store 212 may be managed by data storage server 204 or directly accessed by server 202 or any one of the clients. Various types of data may be created, edited and processed when troubleshooting circuits.

Users may interact with server 202 by running the circuit troubleshooting application 320 from client devices 222, 224, 226, and 228 over network 128. In one embodiment, portions or all of the circuit troubleshooting application 320 may reside on any one or all of the client devices 222, 224, 226, and 228. In such an embodiment, data may be stored in data store 212 without involvement of server 202.

Network 128 may include a secure network such as an enterprise network, or an unsecure network such as a wireless open network. Network 128 may provide communication between the nodes described above. By way of example, and not limitation, network 128 may include wired media such as a wired network or direct-wired connection, and wireless media such as acoustic, RF, infrared and other wireless media.

Many other configurations of computing devices, applications, and data storage may be employed to implement the system 200.

Figure 3:
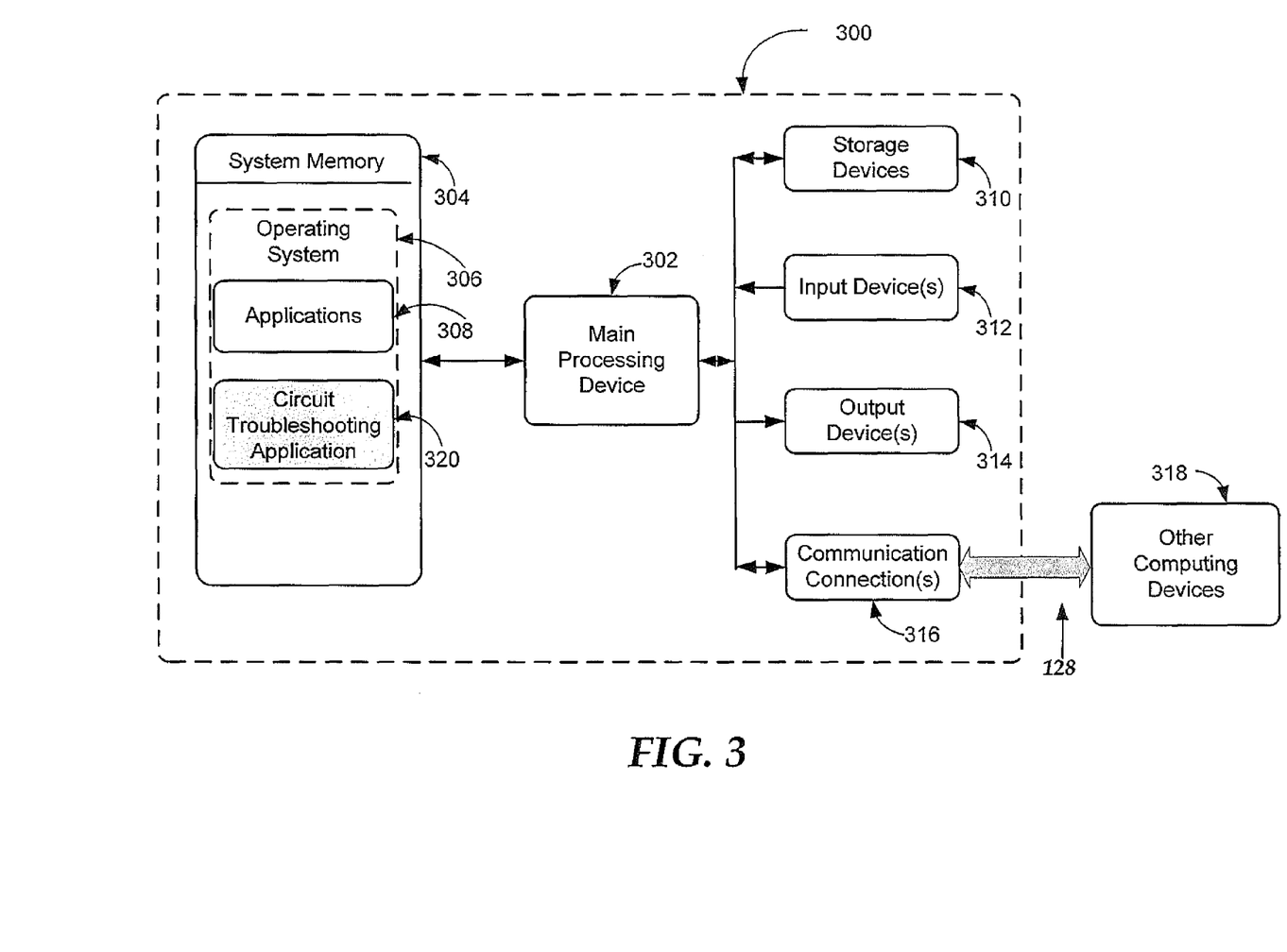
FIG. 3 is a block diagram of a system including a computing device for implementing an embodiment of the invention.

With reference to FIG. 3, one example of the system 200 for implementing the embodiments includes a computing device, such as computing device 300, which may reside on one or more servers, clients, Internet service providers, and communication media within the system 200. Computing device 300 typically includes a main processing unit 302 and system memory 304. The system memory 304 may be volatile (such as RAM), non-volatile (such as ROM, flash memory, etc.) or some combination of the two. System memory 304 typically provides an environment for an operating system 306 to be executed for controlling the operation of computing device 300 and execution of other programs (applications). Software applications 308 and circuit troubleshooting application 320 are examples of programs or program modules that may be executed under the control of operating system 306 in system memory 304. Additional operating systems or programs may also be executed within system memory 304 outside the control of operating system 306. Circuit troubleshooting application 320 enables a user to test circuit functionality for a circuit, e.g. a circuit within communications network 100.

Troubleshooting circuit application 320 may be an integrated part of a file management application or a separate application. Troubleshooting circuit application 320 may communicate with other applications running on computing device 300 or on other devices. Furthermore, troubleshooting circuit application 320 may be executed in an operating system other than operating system 306.

The computing device 300 may have additional features or functionality. For example, the computing device 300 may also include data storage devices 310 (removable and/or non-removable) such as, for example, magnetic disks, optical disks, or tape. Computer storage media may include volatile and nonvolatile, removable and non-removable media implemented in any method or technology for storage of information, such as computer readable instructions, data structures, program modules, or other data. System memory 304 and storage devices 310 are examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 300. Any such computer storage media may be part of device 300.

Computing device 300 may also include input device(s) 312 such as a keyboard, a mouse, a pen, a voice input device, a touch input device, etc. Furthermore, output device(s) 314 such as a display, a speaker, a printer, etc. may also be included.

Communication connections 316 may be included in computing device 300 to allow the device to communicate with other computing devices 318, such as over the network 128, in a distributed computing environment, for example, an intranet or the Internet. Communication connection 316 exemplifies various communication media. Communication media may be embodied by computer readable instructions, data structures, program modules, or other data in a modulated data signal, such as a carrier wave or other transport mechanism, and include any information delivery media.

As stated above, a number of program modules and data files may be stored in system memory 304, including operating system 306. While executing on main processing unit 302, programming modules may perform processes including, for example, one or more stages of method 600 as described below with reference to FIG. 6. The aforementioned method 600 is an example, and main processing unit 302 may perform other processes. Other programming modules that may be used in accordance with embodiments of the present invention may include electronic mail and contacts applications, word processing applications, spreadsheet applications, database applications, slide presentation applications, drawing or computer-aided application programs, etc.

Figure 4:
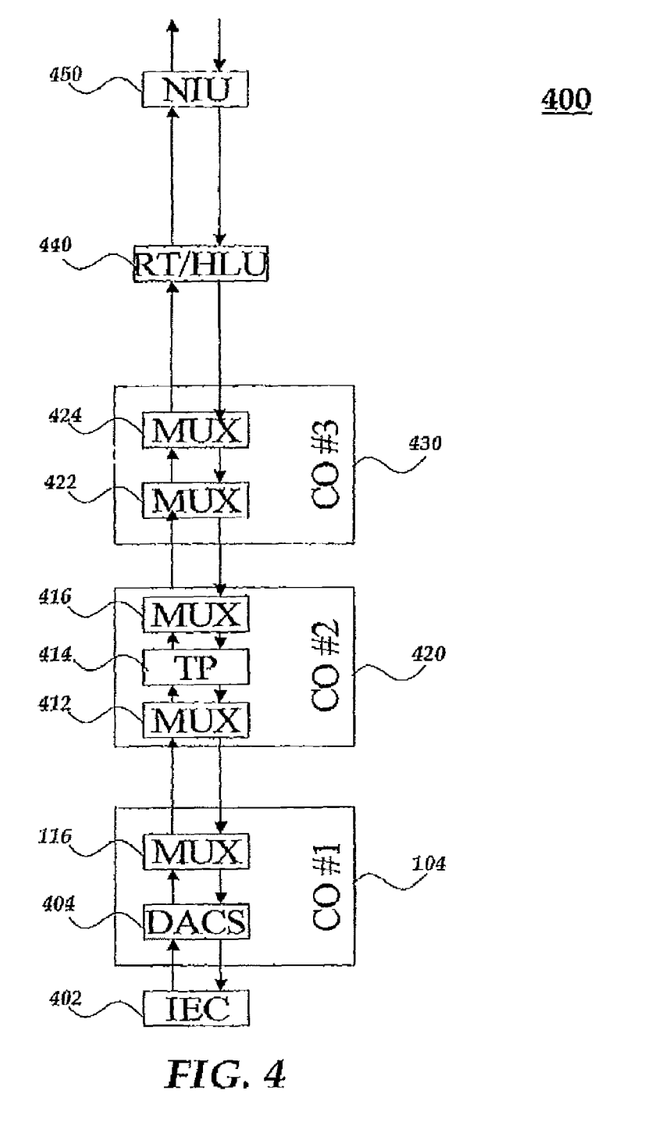
FIG. 4 is a communications circuit consistent with an embodiment of the invention.
Figure 6:
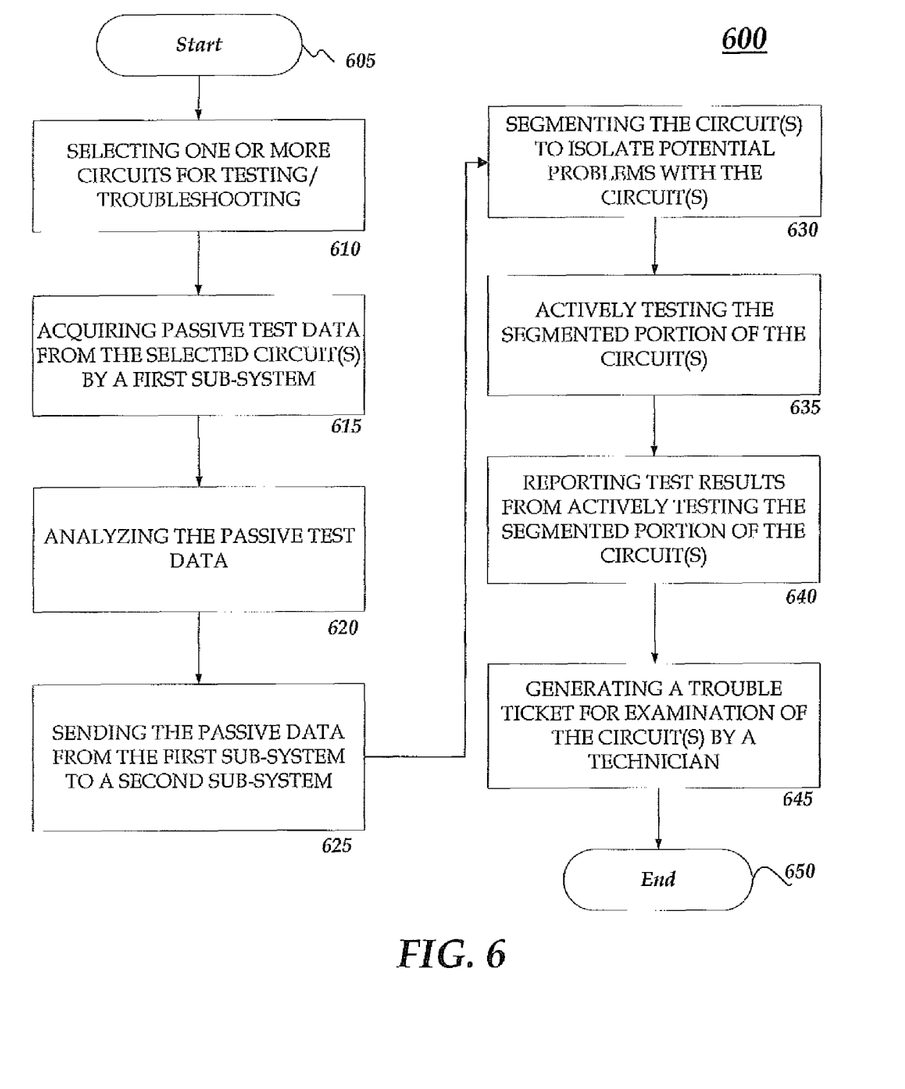
FIG. 6 is a flow diagram according to an embodiment of the present invention.

FIG. 4 illustrates an exemplary communications circuit 400 within the communications network 100 that may be tested using the method 600 consistent with an embodiment of the invention for circuit testing. Circuit 400 is an exemplary communications circuit connecting a customer to an Inter Exchange Carrier (IEC) 402 for a communications company. The IEC 402 may be connected to the CO 104. The CO 104 may include additional circuitry to facilitate communications by the customer, such as digital access cross-connect system (DACS) 404 and subscriber line multiplexer 116 which includes one or more subscriber line card(s) 118 (FIG. 1). Circuit 400 may include additional COs, such as CO 420 and CO 430. CO 420 and CO 430 may also utilize additional circuitry as described above with respect to CO 104 to facilitate communications by the customer. In addition, one or more COs, for example CO 420, may include a test point 414 for testing and troubleshooting circuits between the IEC 402 and the customer. The circuit 400 may also include a remote termination/high bit-rate data subscriber line (RT/HDSL) 440 and a network user interface (NIU) 450.

Figure 5:
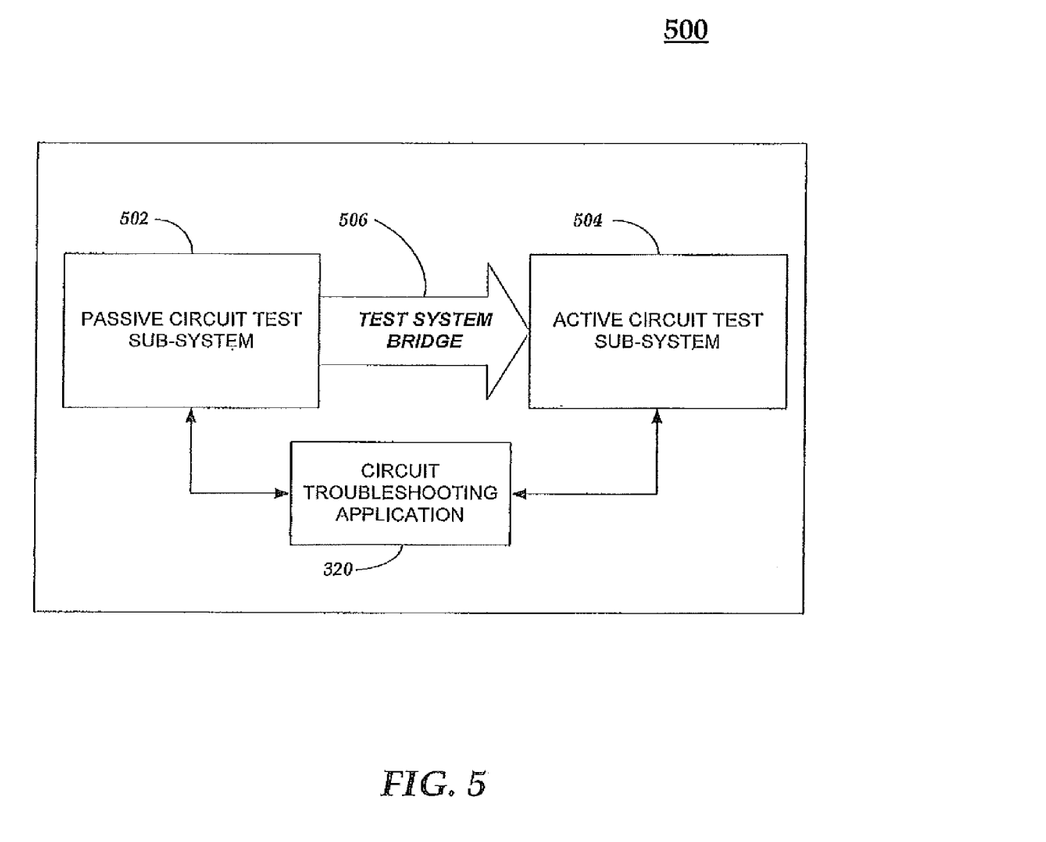
FIG. 5 is an exemplary test system consistent with an embodiment of the invention.

FIG. 5 depicts an exemplary test system 500 consistent with an embodiment of the invention for circuit testing. The test system 500 includes a passive circuit test sub-system 502 for passively testing selected circuitry, for example, circuit 400 (FIG. 4). The passive circuit test sub-system 502 may determine whether problems exist within the circuit 400 by monitoring circuit performance over a specified period. The passive circuit test sub-system 502 may obtain telemetry data and alarm data for circuit 400 by monitoring circuit performance at one or more test points. The passive circuit test sub-system 502 may also generate historical performance data for the selected to further generate trend data for the circuit 400. For example, the circuit 400 may have generated the same alarm at the same time over the course of a week.

The test system 500 includes an active circuit test sub-system 504 actively testing selected circuitry, for example, the circuit 400. An active test for circuit 400 may include inputting test signals into the selected circuit at a test point near a designated portion of the selected circuit, which has been isolated for testing/troubleshooting. Active test for circuit 400 may also include physical layer testing. The test system 500 also includes a test system bridge 506 for transmitting passive test data generated by the passive circuit test sub-system 502 to the active circuit test sub-system 504. Accordingly, the passive test data may be used by the active circuit test sub-system 504 to further narrow and isolate sections of circuit 400 that are most likely the cause of communications problems. In addition, by using passive test data in conjunction with the active circuit test sub-system 504, additional test points within circuit 400 may be tested. Circuit troubleshooting application 320 (FIG. 3) may be used to coordinate circuit troubleshooting using the passive circuit test sub-system 502 and the active circuit test sub-system 504. The circuit troubleshooting application 320 may also facilitate the transmission of passive test data from the passive circuit test sub-system 502 to the active circuit test sub-system 504. Accordingly, the active circuit test sub-system 504 may utilize the passive test data to further refine isolation of potential problems in the selected circuit and conduct the active testing of the selected circuit with increased speed and accuracy.

FIG. 6 is a flow chart setting forth the general stages involved in the method 600 performed by programming modules executing on main processing unit 302 consistent with an embodiment of the invention for circuit testing. Ways to implement the stages of method 600 will be described in greater detail below. Method 600 begins at starting block 605 and proceeds to stage 610 where test points for one or more predetermined circuits are selected for testing by a technician. Next at stage 615, the main processing unit 302 acquires passive testing data for one or more predetermined circuits within communications network 100, for example, alarm and telemetry data, from a passive circuit testing sub-system, for example, passive circuit testing sub-system 502 (FIG. 5). The passive circuit testing sub-system 502 be, for example, an Integrated Network Controller (INC), a product of Alcatel-Lucent Corporation, or any comparable product.

Next at stage 620, the main processing unit 302 analyzes the passive testing data for the one or more predetermined circuits obtained by the passive circuit testing sub-system 502. At stage 625, the passive circuit testing sub-system 502 sends the passive testing data for the one or more predetermined circuits to an active circuit testing sub-system via the test system bridge, for example, active circuit testing sub-system 504 and test system bridge 506 (FIG. 5). The passive circuit testing sub-system 502 acquires telemetry data for a circuit, acquires alarm data for a circuit, and acquires performance history data for a circuit. The test system bridge 506 may be implemented using software, e.g. a software script, hardware, or a combination of software and hardware. The active circuit testing sub-system 504 may be, for example, an Integrated Testing and Analysis System (INTAS), an example of which is available from Telcordia Corporation, or any comparable product.

At stage 630, the active circuit testing sub-system 504 segments the one or more predetermined circuits to isolate an area of the circuit indicated as being problematic. At stage 635, the active circuit testing sub-system 504 tests the segmented circuit to determine if problems exist at the indicated portion of the circuit. The active circuit tests for the circuit may include stressing the indicated portion of the circuit using a test signal between circuit elements, physical layer testing, testing of loopable devices within the circuit, and circuit isolation. At stage 640, the active circuit testing sub-system 504 reports circuit test results to main processing unit 302. At stage 645, the active circuit testing sub-system 504 generates a trouble ticket for on-site manual circuit testing by a technician when required.

Generally, consistent with embodiments of the invention, program modules may be used. Program modules may include routines, programs, components, data structures, and other types of structures that perform particular tasks or that implement particular abstract data types. Moreover, embodiments of the invention may be practiced with other computer system configurations, including hand-held devices, multi-processor systems, microprocessor-based or programmable consumer electronics, minicomputers, mainframe computers, and the like. Embodiments of the invention may also be practiced in distributed computing environments where tasks are performed by remote processing devices that are linked through a communications network. In a distributed computing environment, program modules may be located in both local and remote memory storage devices.

Furthermore, embodiments of the invention may be practiced in an electrical circuit comprising discrete electronic elements, packaged or integrated electronic chips containing logic gates, a circuit utilizing a microprocessor, or on a single chip containing electronic elements or microprocessors. Embodiments of the invention may also be practiced using other technologies capable of performing logical operations such as, for example, AND, OR, and NOT, including but not limited to mechanical, optical, fluidic, and quantum technologies. In addition, embodiments of the invention may be practiced within a general-purpose computer or in any other circuits or systems.

Embodiments of the invention may be implemented, for example, as a computer process (method), a computing system, or as an article of manufacture such as a computer program product or computer readable media. The computer program product may be a computer storage medium readable by a computer system and encoding a computer program of instructions for executing a computer process. Accordingly, the present invention may be embodied in hardware and/or in software (including firmware, resident software, micro-code, etc.). In other words, embodiments of the present invention may take the form of a computer program product on a computer-usable or computer-readable storage medium having computer-usable or computer-readable program code embodied in the medium for use by or in connection with an instruction execution system. A computer-usable or computer-readable medium may be any medium that can contain, store, communicate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus or device. More specific computer-readable medium examples (a non-exhaustive list) include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Embodiments of the present invention, for example, are described above with reference to block diagrams and/or operational illustrations of methods, systems, and computer program products according to embodiments of the invention. The functions/acts noted in the blocks may occur out of the order as show in any flowchart. For example, two blocks shown in succession may in fact be executed substantially concurrently or the blocks may sometimes be executed in the reverse order, depending upon the functionality/acts involved.

While certain embodiments of the invention have been described, other embodiments may exist. Furthermore, although embodiments of the present invention have been described as being associated with data stored in memory and other storage mediums, data can also be stored on or read from other types of computer-readable media, such as secondary storage devices, like hard disks, floppy disks, or a CD-ROM, a carrier wave from the Internet, or other forms of RAM or ROM. Further, the disclosed methods' stages may be modified in any manner, including by reordering stages and/or inserting or deleting stages, without departing from the invention.

While the specification includes examples, the scope of the invention is indicated by the following claims. Furthermore, while the specification has been described in language specific to structural features and/or methodological acts, the claims are not limited to the features or acts described above. Rather, the specific features and acts described above are disclosed as example for embodiments of the invention.

What is claimed is:

1. A method, comprising:
    obtaining, by a processor, performance data acquired from a first test component for a predetermined circuit in a telecommunications network;
    facilitating, by the processor, transfer of the obtained performance data to a second test component, wherein the second test component segments the predetermined circuit into a portion for testing based on the performance data obtained from the first test component and provides test signals to the portion of the predetermined circuit based on the performance data obtained from the first test component;
    obtaining, by the processor, test response data from the portion of the predetermined circuit in response to the provided test signals; and
    determining, by the processor, whether the portion of the predetermined circuit is operating within predefined operational standards based on the obtained test response data.

2. The method of claim 1, wherein the first test component is a passive test component, and the second test component is an active test component.

3. The method of claim 1, wherein the transfer of the performance data obtained from the first test component to the second test component is facilitated over a test system bridge.

4. The method of claim 1, wherein the performance data is acquired from a first set of test points within the predetermined circuit.

5. The method of claim 4, wherein the test response data is obtained from a second set of test points within the predetermined circuit.

6. The method of claim 5, wherein the performance data is used in selecting the second set of test points.

7. The method of claim 1, wherein the performance data comprises historical operation data for the predetermined circuit.

8. The method of claim 1, wherein the performance data is obtained prior to providing the test signals to the predetermined circuit.

9. The method of claim 1, wherein the first test component monitors operation of the predetermined circuit.

10. The method of claim 1, wherein the second test component isolates problems within the predetermined circuit based on the performance data obtained from the first test component.

11. A non-transitory computer-readable storage device having instructions stored thereon which, when executed by a processor, cause the processor to perform operations comprising:
    obtaining performance data acquired from a first test component for a predetermined circuit in a telecommunications network;
    facilitating transfer of the obtained performance data to a second test component, wherein the second test component segments the predetermined circuit into a portion for testing based on the performance data obtained from the first test component and provides test signals to the portion of the predetermined circuit based on the performance data obtained from the first test component;
    obtaining test response data from the portion of the predetermined circuit in response to the provided test signals; and
    determining whether the portion of the predetermined circuit is operating within predefined operational standards based on the obtained test response data.

12. The non-transitory computer-readable storage device of claim 11, wherein the first test component is a passive test component, and the second test component is an active test component.

13. The non-transitory computer-readable storage device of claim 11, wherein the transfer of the performance data obtained from the first test component to the second test component is facilitated over a test system bridge.

14. The non-transitory computer-readable storage device of claim 11, wherein the performance data is acquired from a first set of test points within the predetermined circuit.

15. The non-transitory computer-readable storage device of claim 14, wherein the test response data is obtained from a second set of test points within the predetermined circuit.

16. The non-transitory computer-readable storage device of claim 15, wherein the performance data is used in selecting the second set of test points.

17. The non-transitory computer-readable storage device of claim 11, wherein the performance data comprises historical operation data for the predetermined circuit.

18. The non-transitory computer-readable storage device of claim 11, wherein the performance data is obtained prior to providing the test signals to the predetermined circuit.

19. The non-transitory computer-readable storage device of claim 11, wherein the first test component monitors operation of the predetermined circuit.

20. The non-transitory computer-readable storage device of claim 11, wherein the second test component isolates problems within the predetermined circuit based on the performance data obtained from the first test component.

* * * * *